(12) United States Patent
Takeuchi et al.

(10) Patent No.: US 7,758,951 B2
(45) Date of Patent: Jul. 20, 2010

(54) PREPREG, METAL-CLAD LAMINATE AND PRINTED CIRCUIT BOARD USING SAME

(75) Inventors: Kazumasa Takeuchi, Chikusei (JP);
Makoto Yanagida, Chikusei (JP);
Masaki Yamaguchi, Chikusei (JP);
Katsuyuki Masuda, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 71 days.

(21) Appl. No.: 10/591,696

(22) PCT Filed: Mar. 4, 2005

(86) PCT No.: PCT/JP2005/003753
§ 371 (c)(1),
(2), (4) Date: Jul. 16, 2007

(87) PCT Pub. No.: WO2005/085335
PCT Pub. Date: Sep. 15, 2005

(65) Prior Publication Data
US 2007/0287021 A1    Dec. 13, 2007

(30) Foreign Application Priority Data

| Mar. 4, 2004 | (JP) | ............................. 2004-060581 |
| Mar. 4, 2004 | (JP) | ............................. 2004-060582 |
| Mar. 5, 2004 | (JP) | ............................. 2004-062186 |
| Mar. 24, 2004 | (JP) | ............................. 2004-086630 |

(51) Int. Cl.
*B32B 27/04* (2006.01)
*B32B 27/12* (2006.01)
*D04H 1/00* (2006.01)

(52) U.S. Cl. ................. 428/292.1; 428/221; 428/297.7; 428/301.1

(58) Field of Classification Search .............. 428/297.1, 428/221, 292.1
See application file for complete search history.

(56) References Cited

U.S. PATENT DOCUMENTS 5,395,870 A * 3/1995 Suzuki et al. ............... 524/136

(Continued)

FOREIGN PATENT DOCUMENTS

EP    0 768 334    4/1997

(Continued)

OTHER PUBLICATIONS

Translation of the Preliminary Report on Patentability, for Application No. PCT/JP20054/003753, dated Dec. 7, 2006.

(Continued)

*Primary Examiner*—D. Lawrence Tarazano
*Assistant Examiner*—Camie S Thompson
(74) *Attorney, Agent, or Firm*—Antonelli, Terry, Stout & Kraus, LLP.

(57) ABSTRACT

This invention provides a prepreg which can yield printed circuit boards with excellent dimensional stability and heat resistance and the ability to be bent and housed at high density in electronic device packages, by impregnating a thin fiber base material with a resin having excellent adhesion with metal foils or fiber base materials, excellent heat resistance and high pliability, as well as a metal foil-clad laminate and printed circuit board employing it. The prepreg of the invention is obtained by impregnating a resin composition containing a resin with an imide structure and a thermosetting resin into a fiber base material with a thickness of 5-50 μm.

12 Claims, 3 Drawing Sheets

U.S. PATENT DOCUMENTS

| | | | |
|---|---|---|---|
| 7,138,174 B2 * | 11/2006 | Takeuchi et al. | 428/297.1 |
| 7,157,506 B2 * | 1/2007 | Mizuno et al. | 523/209 |
| 2003/0094232 A1 * | 5/2003 | Saitou et al. | 156/181 |
| 2003/0212245 A1 * | 11/2003 | Tokuhisa et al. | 528/332 |
| 2004/0062858 A1 | 4/2004 | Sato et al. | |
| 2007/0287021 A1 | 12/2007 | Takeuchi et al. | |

FOREIGN PATENT DOCUMENTS

| | | |
|---|---|---|
| JP | 02-105870 | 4/1990 |
| JP | 02-117957 | 5/1990 |
| JP | 03-043413 | 2/1991 |
| JP | 04-227763 | 8/1992 |
| JP | 06-256515 | 9/1994 |
| JP | 10-265760 | 10/1998 |
| JP | 11-335652 | 12/1999 |
| JP | 2000-029212 | 1/2000 |
| JP | 2000-080251 | 3/2000 |
| JP | 2000-212248 | 8/2000 |
| JP | 2000-239496 | 9/2000 |
| JP | 2001-139809 | 5/2001 |
| JP | 2001-240723 | 9/2001 |
| JP | 2002-155114 | 5/2002 |
| JP | 2002-258476 | 9/2002 |
| JP | 2003-55486 | 2/2003 |
| JP | 2003-177534 | 6/2003 |
| JP | 2003-195497 | 7/2003 |
| JP | 2003-233806 | 8/2003 |
| JP | 2003-238806 | 8/2003 |
| JP | 2003-238807 | 8/2003 |
| JP | 2003-268124 | 9/2003 |
| JP | 2003-321607 | 11/2003 |
| JP | 2004-037726 | 2/2004 |
| JP | 2004-095773 | 3/2004 |
| JP | 2005-070655 | 3/2005 |
| JP | 2005-248164 | 9/2005 |
| TW | 564215 | 12/2003 |
| WO | WO 03/051964 | 6/2003 |

OTHER PUBLICATIONS

Supplementary European Search Report for Application No. PCT/JP2005003753, dated Mar. 23, 2007.

Chinese Official Action for Application No. 200580006947.2, dated Feb. 15, 2008.

Japanese Official Action dated Jun. 16, 2009, for Application No. 2004-192020.

Japanese Official Action issued on Oct. 13, 2009, for Application No. 2004-220674.

U.S. Office Action dated Mar. 23, 2010, in U.S. Appl. No. 12/180,384.

Japanese Official Action dated Mar. 16, 2010, for Application No. 2004-220674.

Japanese Official Action dated Mar. 16, 2010, for Application No. 2005-513446.

* cited by examiner

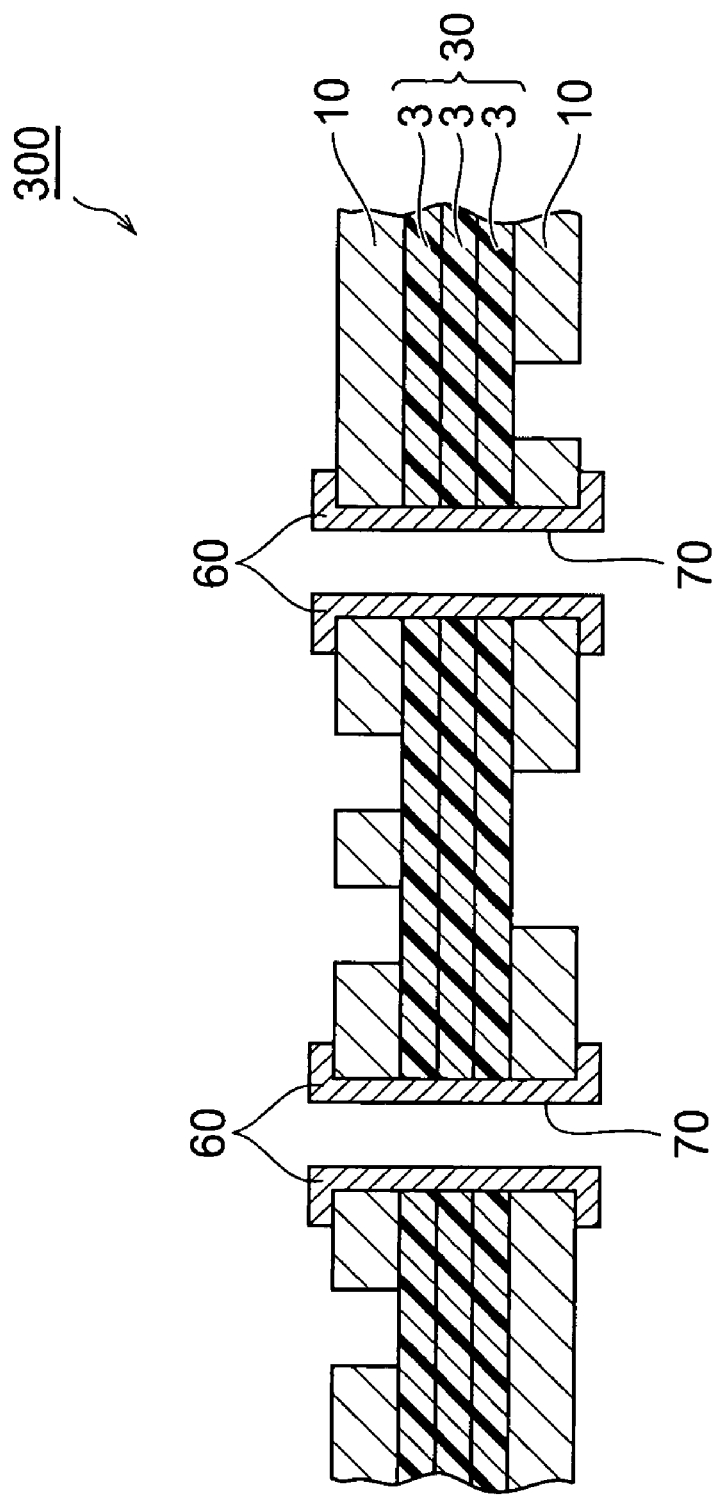

PREPREG, METAL-CLAD LAMINATE AND PRINTED CIRCUIT BOARD USING SAME

TECHNICAL FIELD

The present invention relates to a prepreg and to a metal foil-clad laminate and printed circuit board that employ it.

BACKGROUND ART

Laminates for printed circuit boards are formed by stacking a prescribed number of prepregs comprising an electrical insulating resin composition as the matrix, and subjecting them to heat and pressure for integration.

Metal-clad laminates are used for formation of printed circuits by a subtractive process. Metal-clad laminates are fabricated by stacking a metal foil such as copper foil on a surface (either or both surfaces) of a prepreg and subjecting the stack to heat and pressure. As electrical insulating resins there are commonly used thermosetting resins such as phenol resins, epoxy resins, polyimide resins, bismaleimide-triazine resins and the like. Thermoplastic resins such as fluorine resins or polyphenylene ether resins are also sometimes used.

On the other hand, with the increasing popularity of data terminal devices such as personal computers and cellular phones there is a trend toward miniaturization and high-densification of the printed circuit boards mounted therein. The mounting methods are advancing from pin-insertion types to surface-mounted types, and also to area array types of which BGA (ball grid arrays) using plastic boards are a typical example. In boards where bare chips such as BGA are directly mounted, connection between the chips and boards is commonly achieved by wire bonding using thermosonic bonding. In such cases, the board on which the bare chip is mounted is exposed to high temperatures of 150° C. and above, and therefore the electrical insulating resin must have some degree of heat resistance.

As lead-free solders become more common for environmental reasons, the melting points of solders are increasing as a result. Thus, even higher heat resistance is demanded for boards. Demand for halogen-free materials is also increasing, thus precluding the use of bromine-based flame retardants.

Moreover, for printed circuit boards, the "repair properties" allowing mounted chips to be removed are often required. During repair, the boards are subjected to about the same level of heating as during chip mounting, after which further heat treatment is carried out for remounting of chips. Such treatment has often resulted in peeling between the fiber material and resin in conventional insulating resin systems. Thus, boards exhibiting repair properties must also have cycling heat shock-resistant properties at high temperatures.

Prepregs have been proposed that exhibit excellent heat shock resistance, reflow resistance and crack resistance, and improved microwiring formation properties, by impregnating a resin composition comprising a polyamideimide as an essential component into the fiber material (see Japanese Unexamined Patent Publication No. 2003-55486).

Also, with the trend toward greater miniaturization and higher performance of electronic devices, it is becoming necessary to house part-mounted printed circuit boards in increasingly limited spaces. This is accomplished by methods of arranging multiple printed circuit boards in stacks and connecting them alternately with wire harnesses or flexible wiring boards. There are also used rigid-flex boards which are layered combinations of polyimide-based flexible boards and conventional rigid boards.

DISCLOSURE OF THE INVENTION

Problems to be Solved by the Invention

The present invention has been accomplished in light of the problems of the prior art described above, and its object is to provide a prepreg which can yield printed circuit boards with excellent dimensional stability and heat resistance and the ability to be bent and housed at high density in electronic device packages, by impregnating a thin fiber base material with a resin having excellent adhesion with metal foils or fiber base materials, excellent heat resistance and high pliability, as well as a metal foil-clad laminate and printed circuit board employing it.

Means for Solving the Problems

In order to achieve the aforestated object, the prepreg of the invention is characterized by comprising a resin composition containing a resin with an imide structure and a thermosetting resin, impregnated into a fiber base material with a thickness of 5-50 μm.

In this prepreg, the resin with an imide structure is more preferably one having a siloxane structure.

The resin with an imide structure may also be one having the structure represented by the following general formula (1).

[Chemical Formula 1]

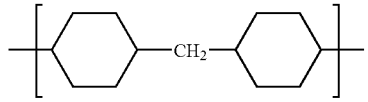

(1)

The resin with an imide structure is more preferably a polyamideimide resin.

More specifically, the resin with an imide structure is preferably a polyamideimide resin obtained by reacting a diisocyanate compound with a mixture containing a diimidedicarboxylic acid obtained by reacting a mixture containing a siloxanediamine and a diamine represented by the following general formula (2a) or (2b) with trimellitic anhydride.

[Chemical Formula 2]

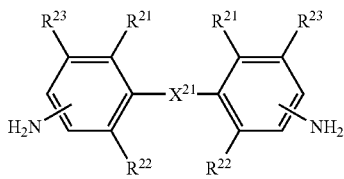

(2a)

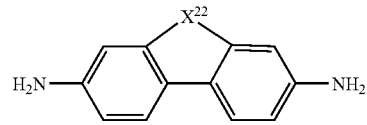

(2b)

[wherein $X^{21}$ represents a C1-3 aliphatic hydrocarbon group, C1-3 halogenated aliphatic hydrocarbon group, sulfonyl group, ether group or carbonyl group, a single bond, a divalent group represented by the following general formula (3a)

or a divalent group represented by the following general formula (3b), $X^{22}$ represents a C1-3 aliphatic hydrocarbon group, C1-3 halogenated aliphatic hydrocarbon group, sulfonyl group, ether group or carbonyl group, and $R^{21}$, $R^{22}$ and $R^{23}$ each independently or identically represent hydrogen, hydroxyl, methoxy, methyl or halogenated methyl.

[Chemical Formula 3]

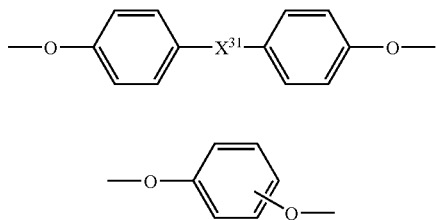

(3a)

(3b)

(wherein $X^{31}$ represents a C1-3 aliphatic hydrocarbon group, C1-3 halogenated aliphatic hydrocarbon group, sulfonyl group, ether group, carbonyl group or a single bond.)]

The resin with an imide structure may also be a polyamideimide resin obtained by reacting a diisocyanate compound with a mixture containing a diimidedicarboxylic acid obtained by reacting a mixture containing a diamine represented by the following general formula (4), a siloxanediamine and a diamine represented by the following general formula (5a) or (5b), with trimellitic anhydride.

[Chemical Formula 4]

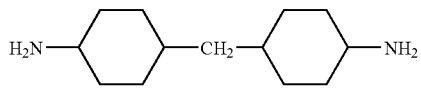

(4)

[Chemical Formula 5]

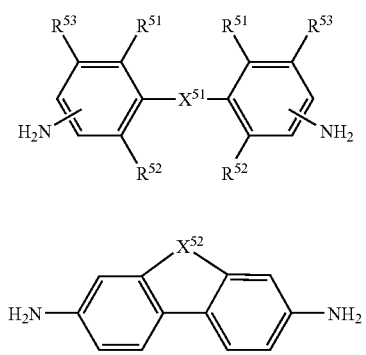

(5a)

(5b)

[wherein $X^{51}$ represents a C1-3 aliphatic hydrocarbon group, C1-3 halogenated aliphatic hydrocarbon group, sulfonyl group, ether group or carbonyl group, a single bond, a divalent group represented by the following general formula (6a) or a divalent group represented by the following general formula (6b), $X^{52}$ represents a C1-3 aliphatic hydrocarbon group, C1-3 halogenated aliphatic hydrocarbon group, sulfonyl group, ether group or carbonyl group, and $R^{51}$, $R^{52}$ and $R^{53}$ each independently or identically represent hydrogen, hydroxyl, methoxy, methyl or halogenated methyl.

[Chemical Formula 6]

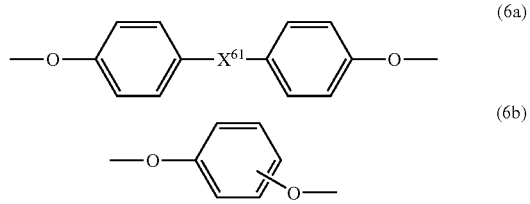

(6a)

(6b)

(wherein $X^{61}$ represents a C1-3 aliphatic hydrocarbon group, C1-3 halogenated aliphatic hydrocarbon group, sulfonyl group, ether group or carbonyl group, or a single bond.)]

The resin with an imide structure may also be a polyimide resin having the structure represented by the following general formula (7) or a polyimide resin having the structure represented by the following general formula (7) and the structure represented by the following general formula (8).

[Chemical Formula 7]

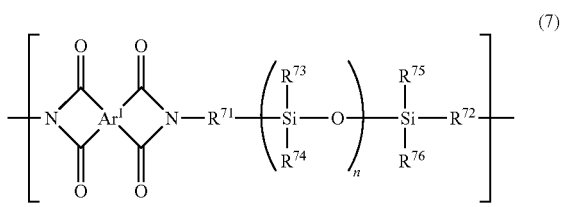

(7)

[Chemical Formula 8]

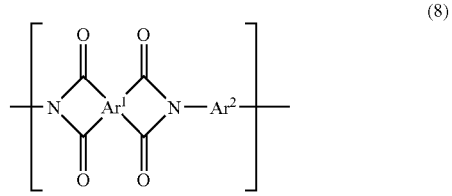

(8)

[wherein $Ar^1$ represents a tetravalent aromatic group, $Ar^2$ represents a divalent aromatic group, $R^{71}$ and $R^{72}$ each independently or identically represent a divalent hydrocarbon group, $R^{73}$, $R^{74}$, $R^{75}$ and $R^{76}$ each independently or identically represent a C1-6 hydrocarbon group, and n represents an integer of 1-50.]

Also, the resin with an imide structure may be a polyamideimide resin having the structure represented by the following general formula (9). Such a polyamideimide resin includes the structure represented by general formula (1) above in the molecule.

[Chemical Formula 9]

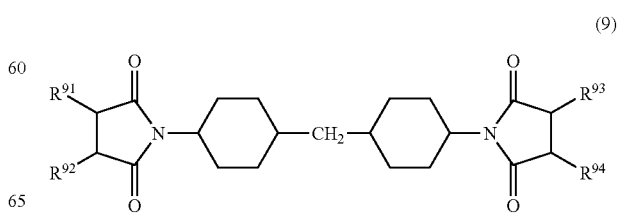

(9)

[wherein $R^{91}$, $R^{92}$, $R^{93}$ and $R^{94}$ each represent a carbon atom from a portion of the cyclic or linear structure composing the polyamideimide resin.]

The thermosetting resin in the resin composition of the prepreg of the invention is preferably an epoxy resin. More preferred are epoxy resins having two or more glycidyl groups.

The resin composition preferably further contains a phosphorus-containing compound, in which case the resin composition preferably contains the thermosetting resin at 1-140 parts by weight with respect to 100 parts by weight of the resin with an imide structure, and phosphorus at 0.1-5 wt % of the resin solid portion.

The resin composition even more preferably further contains a hindered phenol-based or organic sulfur compound-based antioxidant.

As such antioxidants there are preferred one or more types selected from the group consisting of butylated hydroxyanisole, 2,6-di-t-butyl-4-ethylphenol, 2,2'-methylene-bis(4-methyl-6-t-butylphenol), 4,4'-thiobis-(3-methyl-6-t-butylphenol), 4,4'-butylidenebis(3-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl) benzene, tetrakis-[methylene-3-(3',5'-di-t-butyl-4'-hydroxyphenylpropionate)methane, dilauryl thiodipropionate and distearyl thiodipropionate.

The prepreg of the invention preferably has a combustion distance of no greater than 100 mm in a UL-94 VTM test, when cured to form a base material.

The invention further provides a metal foil-clad laminate obtained using the aforementioned prepreg of the invention. Specifically, the metal foil-clad laminate of the invention is obtained by stacking a prescribed number of prepregs of the invention, situating a metal foil on either or both sides and subjecting them to heat and pressure.

The invention further provides a printed circuit board obtained using the aforementioned metal foil-clad laminate of the invention. Specifically, the printed circuit board of the invention is obtained by circuit formation on the metal foil of the metal foil-clad laminate of the invention.

BRIEF EXPLANATION OF THE DRAWINGS

FIG. 3 is a partial cross-sectional view of an embodiment of a printed circuit board.

BEST MODE FOR CARRYING OUT THE INVENTION

Figure 1:
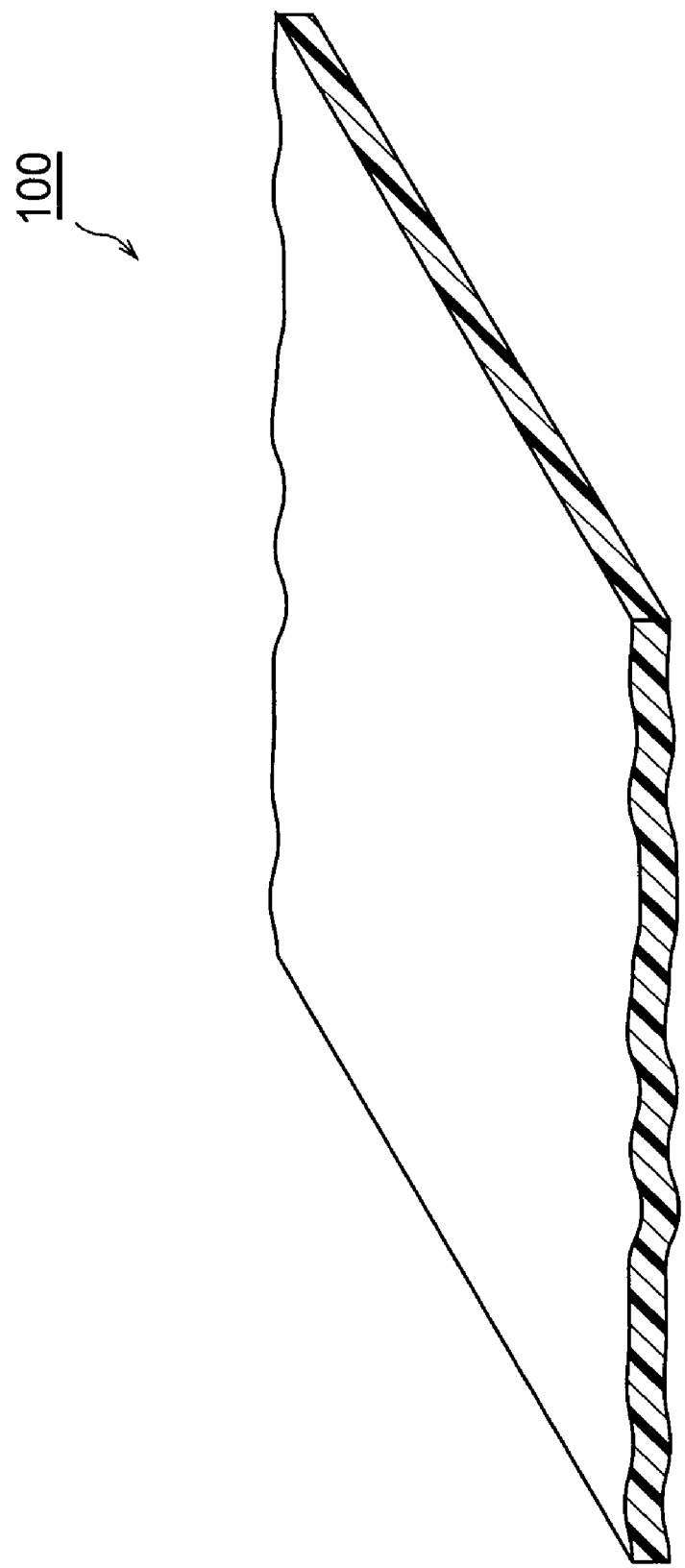
FIG. 1 is a partial perspective view of an embodiment of a prepreg.

Preferred embodiments of the invention will now be explained in detail, with reference to the accompanying drawings as necessary.

[Prepreg]

The prepreg will be explained first. The prepreg of this embodiment is obtained by impregnating a resin composition containing a resin with an imide structure and a thermosetting resin into a fiber base material with a thickness of 5-50 μm. The components in the resin composition will be explained first.

(Resin with an Imide Structure)

The resin with an imide structure is a compound having at least one imide structure in the molecule, and preferred examples include polyamideimide resins, polyimide resins and maleimide resins.

Polyamideimide resins will be described first. A polyamideimide resin is a resin containing an imide group and an amide group in the repeating unit. Suitable polyamideimide resins include siloxane-modified polyamideimide resins having a siloxane structure in the repeating unit.

Preferred as such polyamideimide resins with a siloxane structure are those obtained by reacting an aromatic diisocyanate with a mixture containing a diimidedicarboxylic acid which is obtained by reacting a mixture containing a siloxanediamine and a diamine with two or more aromatic rings represented by general formula (2a) or (2b) above (aromatic diamine) with trimellitic anhydride.

For synthesis of a siloxane-modified polyamideimide resin with a siloxane structure, the blending ratio of the diamine a with two or more aromatic rings and the siloxanediamine b is preferably a/b=99.9/0.1–0/100 (molar ratio), more preferably a/b=95/5–30/70 and even more preferably a/b=90/10–40/60. If the blending proportion of the siloxanediamine b is too large, the Tg will tend to be reduced. If it is too small, on the other hand, a larger amount of varnish solvent will tend to remain in the resin from production of the prepreg.

Examples of aromatic diamines include 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonylbiphenyl-4,4'-diamine, 3,3'-dihydroxybiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether and (3,3'-diamino)diphenyl ether.

As siloxanediamines there may be mentioned compounds represented by the following general formulas (10a)-(10d).

[Chemical Formula 10]

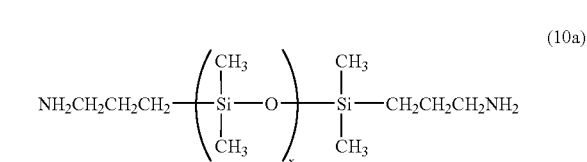

(10a)

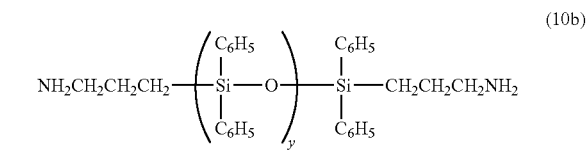

(10b)

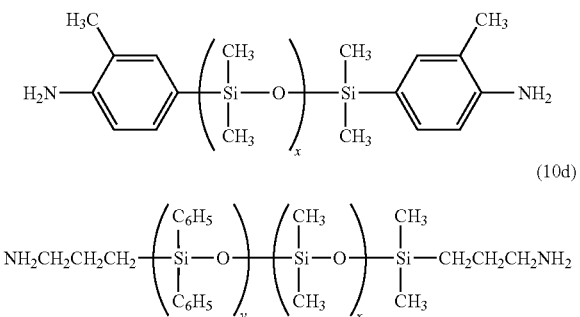

(10c)

(10d)

Examples of siloxanediamines represented by general formula (10a) above include X-22-161AS (450 amine equivalents), X-22-161A (840 amine equivalents), X-22-161B (1500 amine equivalents) (all products of Shin-Etsu Chemical Co., Ltd.), BY16-853 (650 amine equivalents) and BY16-853B (2200 amine equivalents) (all products of Dow Corning Toray Silicone Co., Ltd.). Examples of siloxanediamines represented by general formula (10d) above include X-22-9409 (700 amine equivalents) and X-22-1660B-3 (2200 amine equivalents) (both products of Shin-Etsu Chemical Co., Ltd.).

As diisocyanate compounds to be used for production of polyamideimide resins there may be mentioned compounds represented by the following general formula (11).

[Chemical Formula 11]

$$OCN-D-NCO \quad (11)$$

In formula (11), D is a divalent organic group with at least one aromatic ring, or a divalent aliphatic hydrocarbon group, and it is preferably at least one group selected from the group consisting of $-C_6H_4-CH_2-C_6H_4-$, tolylene, naphthylene, hexamethylene, 2,2,4-trimethylhexamethylene and isophorone.

As diisocyanate compounds represented by general formula (11) above there may be used aliphatic diisocyanate or aromatic diisocyanate compounds, but aromatic diisocyanate compounds are preferred, and combinations of both are especially preferred.

Examples of aromatic diisocyanate compounds include 4,4'-diphenylmethanediisocyanate (MDI), 2,4-tolylenediisocyanate, 2,6-tolylenediisocyanate, naphthalene-1,5-diisocyanate, 2,4-tolylene dimer and the like, with MDI being particularly preferred. Using MDI as an aromatic diisocyanate can improve the flexibility of the obtained polyamideimide resin.

Examples of aliphatic diisocyanate compounds include hexamethylene diisocyanate, 2,2,4-trimethylhexamethylene diisocyanate and isophorone diisocyanate.

When an aromatic diisocyanate and aliphatic diisocyanate are used in combination, the aliphatic diisocyanate is preferably added at about 5-10 mol % with respect to the aromatic diisocyanate. Such use in combination can further improve the heat resistance of the obtained polyamideimide resin.

Also suitable as polyamideimide resins to be included in the resin composition are polyamideimide resins having a structure containing aliphatic rings as represented by general formula (1) above. Preferred among these are polyamideimide resins having both the aforementioned siloxane structure and a structure containing aliphatic rings. Such a polyamideimide resin includes the structure represented by general formula (9) above.

Preferred as polyamideimide resins having both a siloxane structure and a structure containing aliphatic rings, are those obtained by reacting a diisocyanate compound with a mixture containing a diimidedicarboxylic acid obtained by reacting a mixture containing an alicyclic diamine including an aliphatic ring represented by general formula (4) above, a siloxanediamine and a diamine with two or more aromatic rings represented by general formula (5a) or (5b) above (aromatic diamine), with trimellitic anhydride.

The alicyclic diamine represented by general formula (4) above is 4,4'-diaminodicyclohexylmethane, and this compound is available, for example, as WONDAMINE (trade name of New Japan Chemical Co., Ltd.). Examples for the siloxanediamine and aromatic diamine to be used for the reaction include the same compounds mentioned above. For synthesis of a polyamideimide resin having both a siloxane structure and a structure containing aliphatic rings, preferably the blending ratio of the diamine a represented by general formula (4) above (a: moles), and the total of the other diamine with two or more aromatic rings and the siloxanediamine (b: moles) is a/b=0.1/99.9–99.9/0.1 (molar ratio), more preferably it is a/b=10/90–50/50, and even more preferably it is a/b=20/80–40/60.

For production of a polyamideimide containing the aforementioned siloxane structure and/or a structure represented by general formula (1), there may also be used an aliphatic diamine in addition to the siloxanediamine, aromatic diamine, alicyclic diamine, etc. Examples of such aliphatic diamines include compounds represented by the following general formula (12).

[Chemical Formula 12]

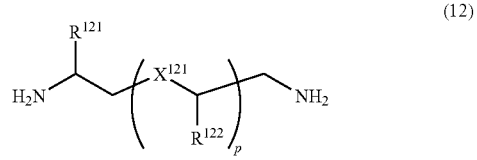

(12)

In formula (12), $X^{121}$ represents methylene, sulfonyl, ether, carbonyl or a single bond, $R^{121}$ and $R^{122}$ each represent hydrogen, alkyl, phenyl or substituted phenyl, and p represents an integer of 1-50.

As specific examples of $R^{121}$ and $R^{122}$ there are preferred hydrogen, C1-3 alkyl, phenyl and substituted phenyl, and examples of substituents bonded to phenyl include C1-3 alkyl, halogens and the like. From the standpoint of achieving both a low elastic modulus and high Tg, the aliphatic diamine is preferably one wherein $X^{121}$ in general formula (12) above is an ether group.

Examples of such aliphatic diamines include JEFFAMINE D-400 (400 amine equivalents) and JEFFAMINE D-2000 (1000 amine equivalents) (both trade names of San Techno Chemical Co., Ltd.).

As the aforementioned polyamideimide resins there are preferred polyamideimide resin containing at least 70 mol % of a polyamideimide molecule having 10 or more amide groups in a molecule. The range can be determined from a chromatogram obtained from GPC (gel permeation chromatography) of the polyamideimide, and from the moles of amide groups per unit weight (A) calculated separately. For example, where the molecular weight (C) of the polyamideimide containing 10 amide groups in each molecule is 10×a/A based on the number of moles (A) of amide groups in the polyamideimide (a)g, and at least 70% of the regions have a number-average molecular weight of C or greater based on the chromatogram obtained by GPC, this corresponds to a content of at least 70 mol % of polyamideimide molecules containing 10 or more amide groups per molecule. The method of quantitating the amide groups may be NMR, IR, hydroxamic acid-iron color reaction, the N-bromoamide method or the like.

The polyimide resin will now be explained. A polyimide resin is a resin containing an imide structure in the repeating unit. As polyimide resins there are preferred those further including a siloxane structure in the repeating unit, and more preferred are polyimide resins having a structure represented by general formula (7) above or having a structure represented by general formula (7) above and a structure represented by general formula (8) above. Such polyimide resins can be obtained by reacting diamine compounds with tetracarboxylic acid dianhydrides.

Siloxanediamines may be mentioned as diamine compounds for obtaining polyimide resins with a structure represented by general formula (7) above. Examples of siloxanediamines include the same compounds used for production of the aforementioned polyamideimide resins.

As diamine compounds for obtaining polyimide resins having both a structure represented by general formula (7) above and a structure represented by general formula (8) above there may be mentioned combinations of siloxanediamines and aromatic diamines. As siloxanediamines there may be mentioned the same compounds used for production of the aforementioned polyamideimide resins. Examples of aromatic diamines include m-phenylenediamine, p-phenylenediamine, 4,4'-diaminodiphenylmethane, 4,4'-diaminodiphenylpropane, benzidine, 4,4'-diaminodiphenylsulfide, 4,4'-diaminodiphenylsulfone, 3,3'-diaminodiphenylsulfone, 4,4'-diaminodiphenyl ether, 4,4'-diamino-p-terphenyl, 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonylbiphenyl-4,4'-diamine, 3,3'-dihydroxybiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether and 3,3'-diaminodiphenyl ether.

When using a combination of a siloxanediamine and an aromatic diamine, the blending ratio of the aromatic diamine "a" and the siloxanediamine "b" is preferably a/b=99.9/0.1–0/100 (molar ratio), more preferably a/b=95/5–30/70 and even more preferably a/b=90/10–50/50. If the blending proportion of the siloxanediamine "b" is too large, the Tg will tend to be reduced. If it is too small, on the other hand, a larger amount of varnish solvent will tend to remain in the resin composition from production of the prepreg.

Examples of tetracarboxylic acid dianhydrides include 3,3',4,4'-diphenylethertetracarboxylic dianhydride, 3,3',4,4'-diphenylsulfonetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,3,3',4'-biphenyltetracarboxylic dianhydride, pyromellitic dianhydride, 1,4,5,8-naphthalenetetracarboxylic dianhydride, 1,4,5,6-naphthalenetetracarboxylic dianhydride, 3,4,9, 10-perylenetetracarboxylic dianhydride, 3,3,6,7-anthracenetetracarboxylic dianhydride, 1,2,7,8-phenanthrenetetracarboxylic dianhydride and 4,4'-(hexafluoroisopropylidene)phthalic dianhydride.

The maleimide resin will now be explained. As maleimide resins there may be mentioned those obtained by reacting a diamine compound and maleic anhydride at a molar ratio of 1:2 to form a bismaleimide, and then mixing this with a triazine or another thermosetting resin. Examples of diamine compounds include the same compounds mentioned above.

(Thermosetting Resin)

As thermosetting resins to be used for the invention there may be mentioned epoxy resins, polyimide resins, unsaturated polyester resins, polyurethane resins, bismaleimide resins, triazine-bismaleimide resins and phenol resins. For example, when using a polyamideimide resin as the resin with an imide structure, the thermosetting resin is preferably used at 1-200 parts by weight and more preferably 1-140 parts by weight with respect to 100 parts by weight of the polyamideimide resin.

As thermosetting resins there are preferred those having organic groups that can react with the amide groups of the polyamideimide resin. Particularly preferred as polyamideimide resins are siloxane-modified polyamideimide resins as mentioned above, in which case the thermosetting resin is preferably one having organic groups that can react with the amide groups in the siloxane-modified polyamideimide resin. More specifically, there are preferred glycidyl group-containing epoxy resins. If the content of the thermosetting resin is less than 1 part by weight to 100 parts by weight of the polyamideimide resin, the solvent resistance will tend to be inferior. On the other hand, if it exceeds 200 parts by weight the Tg will be lower due to the unreacted thermosetting resin, leading to insufficient heat resistance and undesirable reduction in flexibility. Thus, the content of the thermosetting resin is more preferably 3-100 parts by weight and even more preferably 10-60 parts by weight to 100 parts by weight of the polyamideimide resin.

As epoxy resins there may be mentioned polyglycidyl ethers obtained by reacting epichlorhydrin with a polyhydric phenol such as bisphenol A, a novolac-type phenol resin or an orthocresol/novolac-type phenol resin or with a polyhydric alcohol such as 1,4-buthane diol, polyglycidyl esters obtained by reacting epichlorhydrin with a polybasic acid such as phthalic acid or hexahydrophthalic acid, N-glycidyl derivatives of compounds with amine, amide or heterocyclic nitrogenous bases, and alicyclic epoxy resins.

By using an epoxy resin as the thermosetting resin, it is possible to cure the prepreg at a temperature of below 180° C. In order to further improve the thermal, mechanical and electrical properties by reaction with the amide groups of the siloxane-modified polyamideimide resin, it is preferred to use as the epoxy resin a combination of an epoxy resin with two or more glycidyl groups and its curing agent, a combination of an epoxy resin with two or more glycidyl groups and its curing accelerator, or a combination of an epoxy resin with two or more glycidyl groups and its curing agent and curing accelerator. A greater number of glycidyl groups is preferred, with 3 or more being more preferred. The content of the thermosetting resin will differ depending on the number of glycidyl groups, and the content may be lower with a larger number of glycidyl groups.

The curing agent and curing accelerator for the epoxy resin are not particularly restricted so long as they react with the epoxy resin or promote its curing, and there may be used, for example, amines, imidazoles, polyfunctional phenols, acid anhydrides and the like. As amines there may be used dicyandiamide, diaminodiphenylmethane, guanylurea and the like. As polyfunctional phenols there may be used hydroquinone, resorcinol, bisphenol A and their halogenated forms, as well as novolac-type phenol resins and resol-type phenol resins that are condensates with formaldehyde. As acid anhydrides there may be used phthalic anhydride, benzophenonetetracarboxylic dianhydride, methylhymic acid and the like. As curing accelerators there may be used imidazoles such as alkyl-substituted imidazoles and benzimidazoles.

The preferred amount of such a curing agent or curing accelerator is, in the case of an amine, an amount such that the equivalents of active hydrogen of the amine and epoxy equivalents of the epoxy resin are approximately equal. For an imidazole as the curing accelerator there is no simple equivalent ratio with active hydrogen, and the amount is preferably 0.001-10 parts by weight to 100 parts by weight of the epoxy resin. In the case of a polyfunctional phenol or acid anhydride, the required amount is 0.6-1.2 equivalents of phenolic hydroxyl or carboxyl groups with respect to one equivalent of the epoxy resin. A small amount of such a curing agent or curing accelerator will leave some amount of uncured epoxy resin and will lower the Tg (glass transition temperature), while a large amount will leave some amount of unreacted curing agent and curing accelerator, thereby lowering the insulating property. Since the epoxy equivalents of the epoxy resin can also react with the amide groups of the siloxane-modified polyamideimide resin, this is preferably taken into account.

(Other Components)

The resin composition may also contain other components in addition to the aforementioned resin with an imide structure and the thermosetting resin. As examples of such additional components there may be mentioned phosphorus-containing compounds.

A phosphorus-containing compound can improve the flame retardance of the prepreg, and specifically phosphorus-based flame retardants (phosphorus-containing fillers) are preferred. As phosphorus-based flame retardants there may be mentioned OP930 (product of Clariant Japan, phosphorus content: 23.5 wt %), HCA-HQ (product of Sanko Co., Ltd., phosphorus content: 9.6 wt %), and the melamine polyphosphates PMP-100 (phosphorus content: 13.8 wt %), PMP-200 (phosphorus content: 9.3 wt %) and PMP-300 (phosphorus content: 9.8 wt %) (all products of Nissan Chemical Industries, Ltd.).

A larger amount of phosphorus-based flame retardant added as a phosphorus-containing compound will improve the flame retardance, but if it is too large the pliability of the base material will be reduced and the printed circuit board obtained therefrom will have reduced heat resistance. The amount of phosphorus-based flame retardant to be added will differ depending on the type and thickness of the fiber base material impregnated with the resin composition, and for example, when using a fiber base material with a thickness of 5-50 μm (such as a glass cloth) in a prepreg as described hereunder, it is preferred to adjust the amount so that the laminate produced from the prepreg has a combustion distance of no greater than 100 mm in the UL-94 VTM test. Such a laminate exhibits sufficient properties from the standpoint of pliability, while also exhibiting satisfactory properties in terms of heat resistance in a heat shock test.

When the resin composition contains a polyamideimide and a thermosetting resin as described above, the amide groups and imide groups in the polyamideimide can be utilized as a nitrogen source for flame retardance. In this case, the amount of the phosphorus-containing compound such as a phosphorus-based flame retardant added to the resin composition is such for a phosphorus content of preferably 0.1-5 wt % and more preferably 2-4 wt % of the total solid weight of the resin of the resin composition. The phosphorus-based flame retardant content may therefore be determined in consideration of the amount of phosphorus contained therein.

One or more antioxidants from among hindered phenol-based antioxidants and organic sulfur compound-based antioxidants may also be included in the resin composition. For example, using a hindered phenol-based antioxidant can improve the electrical insulating characteristics without impairing the other properties such as drill working properties.

Hindered phenol-based antioxidants include monophenol-based antioxidants such as butylated hydroxyanisole and 2,6-di-t-butyl-4-ethylphenol, bisphenol-based antioxidants such as 2,2'-methylene-bis-(4-methyl-6-t-butylphenol), 4,4'-thio-bis-(3-methyl-6-t-butylphenol) and 4,4'-butylidenebis(3-methyl-6-t-butylphenol), and high molecular phenols such as 1,1,3-tris(2-methyl-4-hydroxy-5-butylphenyl)butane, 1,3,5-trimethyl-2,4,6-tris(3,5-di-t-butyl-4-hydroxybenzyl)benzene and tetrakis-[methylene-3-(3',5'-di-t-butyl-4'-hydroxyphenyl)propionate]methane. Organic sulfur compound-based antioxidants include dilauryl thiodipropionate, distearyl thiodipropionate and the like. Antioxidants are preferably one or more selected from the aforementioned group of antioxidants, and different types may be used in combination. The content of the antioxidant is preferably 0.1-20 parts by weight to 100 parts by weight of the thermosetting resin. More preferably, the content of the antioxidant is 0.1-20 parts by weight to 100 parts by weight of the epoxy resin. If the content of the antioxidant is less than 0.1 part by weight no improvement in insulating property will be achieved, and if it exceeds 20 parts by weight the insulating property will tend to be reduced.

As mentioned above, the prepreg of this embodiment is obtained by impregnating a resin composition containing a resin with an imide structure, a thermosetting resin and other components into a fiber base material with a thickness of 5-50 μm. FIG. 1 is a partial perspective view of an embodiment of a prepreg. The prepreg 100 of FIG. 1 is a sheet-like prepreg composed of a fiber base material and a resin composition impregnated in it.

Such a prepreg can be obtained by preparing a varnish by mixing, dissolving and dispersing a resin composition for prepreg in an organic solvent, and then impregnating it into a fiber material and drying. The organic solvent is not particularly restricted so long as it is able to dissolve or disperse the resin composition, and as examples there may be mentioned dimethylacetamide, dimethylformamide, dimethylsulfoxide, N-methyl-2-pyrrolidone, γ-butyrolactone, sulfolane and cyclohexanone.

The resin composition for prepreg may be the resin composition described above, but preferably it contains 100 parts by weight of a resin with an imide structure (siloxane-modified polyamideimide resin, polyamideimide resin having the structure represented by general formula (1) above or polyimide resin) and 1-200 parts by weight (preferably 1-140 parts by weight) of a thermosetting resin. This will increase the vaporization rate of the varnish solvent of the resin composition, making it possible to achieve a residual solvent content of 5 wt % or less even at a low temperature of below 150° C. at which the thermosetting resin curing reaction is not promoted. The resin composition will thus have satisfactory adhesion with the fiber base material or copper foil. In particular, since the siloxane-modified polyamideimide resin has the highly heat resistant polyamideimide resin modified with siloxane, the aforementioned effect can be satisfactorily achieved. Because the amount of residual solvent can thus be minimized, the prepreg exhibits less swelling due to solvent vaporization during the step of lamination with the copper foil, and has excellent soldering heat resistance.

More specifically, the prepreg can be fabricated by impregnating the fiber base material with the resin composition varnish and drying it in a temperature range of 80-180° C. The fiber base material is not particularly restricted so long as it is one used for fabrication of metal foil-clad laminates and multilayer printed circuit boards, and as examples there may be mentioned fiber base materials such as woven fabrics and nonwoven fabrics. As materials for the fiber base material there may be mentioned inorganic fibers such as glass, alumina, asbestos, boron, silica-alumina glass, silica glass, tirano, silicon carbide, silicon nitride and zirconia, organic fibers such as aramid, polyetherether ketone, polyetherimide, polyethersulfone, carbon and cellulose, and blended systems thereof, among which woven fabrics of glass fibers are preferred.

Among these, glass cloths with a thickness of 5-50 µm are preferred as fiber base materials to be used in prepregs. By using a glass cloth with a thickness of 5-50 µm, it is possible to obtain a printed circuit board that can be folded as desired, and which undergoes minimal dimensional change with the temperature and humidity of the manufacturing process.

The manufacturing conditions for the prepreg are not particularly restricted, but preferred are conditions wherein at least 80 wt % of the solvent used in the varnish evaporates. The fabrication process and drying conditions are also not particularly restricted, and for example, the temperature for drying may be 80-180° C., and the time may be adjusted in balance with the varnish gelling time. The amount of varnish impregnated into the fiber base material is preferably such for a varnish solid content of 30-80 wt % with respect to the total amount of solid varnish and fiber base material.

When the prepreg is cured for use as the base material, it preferably has a flame retardance as a combustion distance of no greater than 100 mm in the UL-94 VTM test. This condition is more preferably satisfied when the resin composition contains the aforementioned phosphorus-containing compound.

The flame retardance may be evaluated by the UL-94 VTM test. The sample used for the test may be fabricated by etching off the copper from a double-sided copper-clad laminate prepared using the aforementioned prepreg, and then cutting it to a 200 mm length and 50 mm width, wrapping it around a mandrel with a 12.7 mm diameter and fixing it with tape at a position 125 mm from the end to form a cylinder, and finally slipping out the mandrel.

The measurement is carried out by situating the sample vertically and closing and anchoring the top end with a spring, and then contacting the bottom end with a 20 mm blue flame created with a methane gas burner for 3 seconds and measuring the afterflame time and combustion distance. A sample exhibiting a flame retardance as a combustion distance of 100 mm or smaller in this measurement may be considered a satisfactory prepreg in terms of pliability and heat resistance in a heat shock test.

[Metal Foil-clad Laminate]

The prepreg described above may be used to obtain insulating boards, laminates and metal foil-clad laminates. Specifically, for example, the prepreg may be used alone or a plurality thereof laminated into a laminate, stacked with a metal foil on either or both sides as necessary, and subjected to hot pressure molding at a temperature in the range of 150-280° C. or preferably 180-250° C., and a pressure in the range of 0.5-20 MPa or preferably 1-8 MPa, to fabricate an insulating board, laminate or metal foil-clad laminate. A metal foil-clad laminate can be obtained when using a metal foil.

Suitable metal foils include copper foils and aluminum foils, and they may have thicknesses of 5-200 µm. The metal foil may be a composite foil with a three-layer structure provided with an interlayer made of nickel, nickel-phosphorus, nickel-tin alloy, nickel-iron alloy, lead, lead-tin alloy or the like, having a 0.5-15 µm copper layer and a 10-300 µm copper layer on either side, or a composite foil with a two-layer structure comprising aluminum and copper foils.

Figure 2:
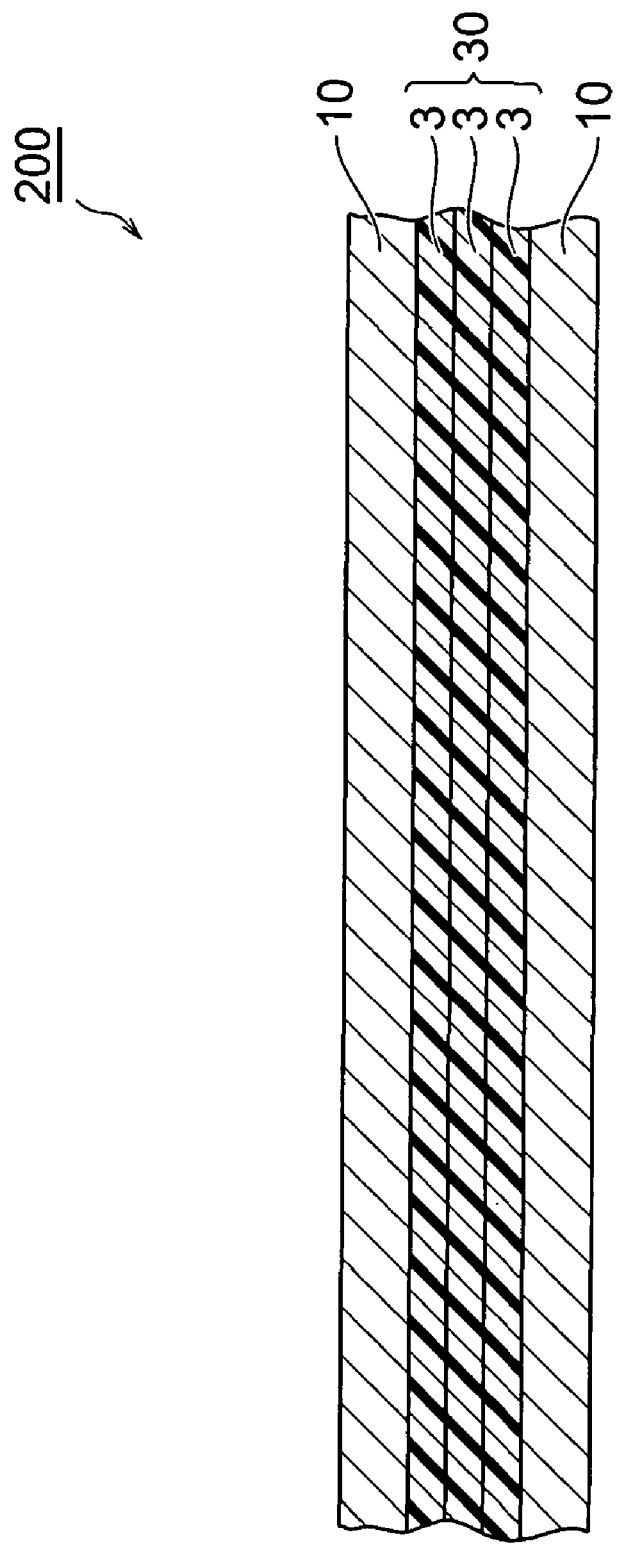
FIG. 2 is a partial cross-sectional view of an embodiment of a metal foil-clad laminate.

FIG. 2 is a partial cross-sectional view of an embodiment of a metal foil-clad laminate. The metal foil-clad laminate 200 is obtained by heating and pressing a laminate of a prepreg 100 having a prescribed number of layers (three in this case) and a copper foil 10 situated on both sides thereof, and it is composed of a sheet-like board 30 composed of a laminate of a fiber-reinforced resin layer 3 and two metal foils 10 adhered on either side of the board 30.

[Printed Circuit Board]

The aforementioned metal foil-clad laminate can be used to obtain a printed circuit board. Specifically, a printed circuit board may be obtained by forming a circuit from the metal foil of the metal foil-clad laminate (circuit formation). The circuit formation may be accomplished by a publicly known process such as a subtractive process.

FIG. 3 is a partial cross-sectional view of an embodiment of a printed circuit board. The printed circuit board 300 shown in FIG. 3 is composed mainly of the same board 30 as described above and two metal foils 10 attached to either side of the board 30, and portions of the metal foils 10 are removed to form a wiring pattern. The printed circuit board 300 also has multiple through-holes 70 formed running through the circuit board 300 in the direction approximately normal to the main surface. The walls of the through-holes 70 have a metal plating layer 60 formed to a prescribed thickness. Normally, predetermined circuit parts (not shown) are mounted in the printed circuit board 300.

EXAMPLES

The present invention will now be explained in greater detail by examples, with the understanding that the invention is in no way limited to these examples.

Synthesis Example 1A

In a 1-liter separable flask there were placed 31.0 g (0.10 mol) of 3,3',4,4'-diphenylethertetracarboxylic dianhydride, 200 g of NMP (N-methyl-2-pyrrolidone) and 200 g of m-xylene, and the mixture was stirred at room temperature (25° C.). Next, 34.4 g (0.04 mol) of the reactive silicone oil KF-8010 (trade name of Shin-Etsu Chemical Co., Ltd., amine equivalents: 430) as a siloxanediamine was added dropwise using a dropping funnel. The reaction mixture was stirred while cooling on ice, and then 24.6 g (0.06 mol) of BAPP (2,2-bis[4-(4-aminophenoxy)phenyl]propane) was added as an aromatic diamine and stirring was continued for 2 hours at room temperature to obtain polyamic acid. The polyamic acid solution was heated to 190° C. and then heated and stirred for 20 hours, and the water produced with imide ring closure was removed by azeotropic distillation with m-xylene. Upon completion of the reaction, an NMP solution containing a polyimide resin was obtained.

Synthesis Example 2A

In a 1-liter separable flask there were placed 29.4 (0.10 mol) of 3,3',4,4'-benzophenonetetracarboxylic dianhydride, 200 g of NMP (N-methyl-2-pyrrolidone) and 200 g of m-xylene, and the mixture was stirred at room temperature. Next, 34.4 g (0.04 mol) of the reactive silicone oil KF-8010 (trade name of Shin-Etsu Chemical Co., Ltd., amine equivalents: 430) as a siloxanediamine was added dropwise using a dropping funnel. The reaction mixture was stirred while cooling on ice, and then 24.6 g (0.06 mol) of BAPP (2,2-bis[4-(4-aminophenoxy)phenyl]propane) was added as an aromatic diamine and stirring was continued for 2 hours at room temperature (25° C.) to obtain polyamic acid. The polyamic acid solution was heated to 190° C. and then heated and stirred for 20 hours, and the water produced with imide ring closure was removed by azeotropic distillation with m-xylene. Upon completion of the reaction, an NMP solution containing a polyimide resin was obtained.

Example 1A

After mixing 265.0 g of an NMP solution of the polyimide resin obtained in Synthesis Example 1A (30.2 wt % solid resin content), 40.0 g of NC3000 (trade name of Nippon Kayaku Co., Ltd.) as an epoxy resin (dimethylacetamide solution with 50 wt % resin solid content) and 0.2 g of 2-ethyl-4-methylimidazole, the mixture was stirred for about 1 hour until uniformity of the resin. It was then allowed to stand for 24 hours at room temperature (25° C.) for defoaming to produce a resin composition varnish.

Example 2A

After mixing 216.8 g of an NMP solution of the polyimide resin obtained in Synthesis Example 2A (36.9 wt % solid resin content), 40.0 g of NC3000 (trade name of Nippon Kayaku Co., Ltd.) as an epoxy resin (dimethylacetamide solution with 50 wt % resin solid content) and 0.2 g of 2-ethyl-4-methylimidazole, the mixture was stirred for about 1 hour until uniformity of the resin. It was then allowed to stand for 24 hours at room temperature (25° C.) for defoaming to produce a resin composition varnish.

Example 3A

After mixing 248.3 g of an NMP solution of the polyimide resin obtained in Synthesis Example 1A (30.2 wt % solid resin content), 50.0 g of DER331L (trade name of Dainippon Ink & Chemicals, Inc.) as an epoxy resin (dimethylacetamide solution with 50 wt % resin solid content) and 0.25 g of 2-ethyl-4-methylimidazole, the mixture was stirred for about 1 hour until uniformity of the resin. It was then allowed to stand for 24 hours at room temperature (25° C.) for defoaming to produce a resin composition varnish.

(Fabrication of Prepreg and Metal Foil-clad Laminate)

Each of the resin composition varnishes prepared in Examples 1A-3A was impregnated into a glass cloth with a thickness of 0.028 mm (trade name 1037 of Asahi Shwebel Co., Ltd.), and then heated at 150° C. for 15 minutes for drying to obtain a prepreg with a 70 wt % resin portion. A 12 μm-thick electrolytic copper foil (trade name: F2-WS-12 by Furukawa Electric Co., Ltd.) was stacked onto both sides of the prepreg with the adhesive sides facing the prepreg, and subjected to pressing conditions of 200° C., 90 min, 4.0 MPa to fabricate a double-sided copper clad laminate.

Comparative Example 1A

The resin composition varnish of Example 1A was used for impregnation into a glass cloth with a thickness of 0.10 mm (100 μm) (trade name 7010 of Nitto Boseki Co., Ltd.), and was then heated at 150° C. for 25 minutes for drying to obtain a prepreg with a 70 wt % resin portion. A 12 μm-thick electrolytic copper foil (trade name: F2-WS-12 by Furukawa Electric Co., Ltd.) was stacked onto both sides of the prepreg with the adhesive sides facing the prepreg, and subjected to pressing conditions of 200° C., 90 min, 4.0 MPa to fabricate a double-sided copper clad laminate.

The obtained double-sided copper clad laminate was used for the following evaluation.

(Evaluations)
(1) The copper foil peel strength of the double-sided copper clad laminate was measured.
(2) Upon immersion for 5 minutes in soldering baths at 260° C., 288° C. and 300° C., abnormalities such as swelling or peeling were observed. The evaluation was made in the following manner.
   ◯: No abnormalities, × Abnormalities.
(3) The copper foil was etched for removal and the laminate was folded to evaluate the pliability. The evaluation was made in the following manner.
   ◯: No fracture, × Fracture.
(4) A circuit was formed on the double-sided copper clad laminate to prepare a daisy chain pattern test piece. Each test piece was subjected to 1000 cycles of a heat shock test with each cycle being −65° C./30 min, 125° C./30 min, and the change in resistance was measured. The evaluation was made in the following manner.
   ◯: No greater than 10% resistance change, ×: Greater than 10% resistance change.

The obtained results are shown in Table 1.

TABLE 1

| Evaluation | Units | Example 1A | Example 2A | Example 3A | Comp. Example 1A |
|---|---|---|---|---|---|
| Polyimide resin | — | Synthesis Example 1A | Synthesis Example 2A | Synthesis Example 1A | Synthesis Example 1A |
| Epoxy resin | — | NC3000 | NC3000 | DER331L | NC3000 |
| Polyimide/epoxy | pts. by wt. | 80/20 | 80/20 | 75/25 | 80/20 |
| Pliability | — | ◯ | ◯ | ◯ | × |
| Soldering heat resistance | — | ◯ | ◯ | ◯ | ◯ |
| Heat shock test | — | ◯ | ◯ | ◯ | ◯ |
| Copper foil peel strength | kN/m | 1.2 | 0.9 | 1.0 | 1.1 |

All of the prepregs of Examples 1A-3A were satisfactory with high values of 0.9-1.2 kN/m for the copper foil peel strength. Also, the soldering heat resistance (260° C. soldering, 288° C. soldering, 300° C. soldering) was 5 minutes or longer at all temperatures, and no abnormalities such as swelling or peeling were observed. In the heat shock test, the resistance change was within 10% at 1000 cycles, indicating satisfactory connection reliability. Also, the pliability was sufficient to allow folding as desired.

In contrast, the double-sided copper clad laminate of Comparative Example 1A had no pliability, and cracks formed in the glass cloth and resin sections upon folding. Warping was also observed.

Synthesis Example 1B

In a 1-liter separable flask equipped with a cock-stoppered 25-ml water measuring receptacle connected to a reflux condenser, and a thermometer and stirrer, there were charged 14.9 g (0.06 mol) of DDS (diaminodiphenylsulfone) as a diamine with two or more aromatic rings, 43.0 g (0.05 mol) of the reactive silicone oil KF-8010 (trade name of Shin-Etsu Chemical Co., Ltd., amine equivalents: 430) as a siloxanediamine, 72.0 g (0.36 mol) of JEFFAMINE D2000 (trade name of San Techno Chemical Co., Ltd., amine equivalents: 1000) as an aliphatic diamine, 11.3 g (0.054 mol) of WONDAMINE (trade name of New Japan Chemical Co., Ltd.) as a diamine represented by general formula (4) and 80.7 g (0.42 mol) of TMA (trimellitic anhydride), with 589 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 55.1 g (0.22 mol) of MDI (4,4'-diphenylmethanediisocyanate) was loaded as an aromatic diisocyanate for 2 hours of reaction at 190° C. Upon completion of the reaction there was obtained an NMP solution containing a polyamideimide resin.

Synthesis Example 2B

In a 1-liter separable flask equipped with a cock-stoppered 25-ml water measuring receptacle connected to a reflux condenser, and a thermometer and stirrer, there were charged 14.9 g (0.06 mol) of DDS (diaminodiphenylsulfone) as a diamine with two or more aromatic rings, 51.6 g (0.06 mol) of the reactive silicone oil KF-8010 (trade name of Shin-Etsu Chemical Co., Ltd., amine equivalents: 430) as a siloxanediamine, 52.0 g (0.26 mol) of JEFFAMINE D2000 (trade name of San Techno Chemical Co., Ltd., amine equivalents: 1000) as an aliphatic diamine, 11.3 g (0.054 mol) of WONDAMINE (trade name of New Japan Chemical Co., Ltd.) as a diamine represented by general formula (4) and 80.7 g (0.42 mol) of TMA (trimellitic anhydride), with 575 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 55.1 g (0.22 mol) of MDI (4,4'-diphenylmethanediisocyanate) was loaded as an aromatic diisocyanate for 2 hours of reaction at 190° C. Upon completion of the reaction there was obtained an NMP solution containing a polyamideimide resin.

Synthesis Example 3B

In a 1-liter separable flask equipped with a cock-stoppered 25-ml water measuring receptacle connected to a reflux condenser, and a thermometer and stirrer, there were charged 14.9 g (0.06 mol) of DDS (diaminodiphenylsulfone) as a diamine with two or more aromatic rings, 43.0 g (0.05 mol) of the reactive silicone oil KF-8010 (trade name of Shin-Etsu Chemical Co., Ltd., amine equivalents: 430) as a siloxanediamine, 72.0 g (0.36 mol) of JEFFAMINE D2000 (trade name of San Techno Chemical Co., Ltd., amine equivalents: 1000) as an aliphatic diamine, 11.3 g (0.054 mol) of WONDAMINE (trade name of New Japan Chemical Co., Ltd.) as a diamine represented by general formula (4) and 80.7 g (0.42 mol) of TMA (trimellitic anhydride), with 599 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 60.1 g (0.24 mol) of MDI (4,4'-diphenylmethanediisocyanate) was loaded as an aromatic diisocyanate for 2 hours of reaction at 190° C. Upon completion of the reaction there was obtained an NMP solution containing a polyamideimide resin.

Example 1B

After mixing 250.0 g of an NMP solution of the polyamideimide resin (PAI) of Synthesis Example 1B (32 wt % solid resin content), 40.0 g of NC3000 (trade name of Nippon Kayaku Co., Ltd.) as an epoxy resin (Ep) (dimethylacetamide solution with 50 wt % solid resin content) and 0.2 g of 2-ethyl-4-methylimidazole, the mixture was stirred for about 1 hour until uniformity of the resin and then allowed to stand for 24 hours at room temperature (25° C.) for defoaming to obtain a resin composition varnish.

Example 2B

A resin composition varnish was obtained in the same manner as Example 1B, except that an NMP solution of the polyamideimide resin (PAI) of Synthesis Example 2B was used instead of the polyamideimide resin (PAI) of Synthesis Example 1B.

Example 3B

A resin composition varnish was obtained in the same manner as Example 1B, except that an NMP solution of the polyamideimide resin (PAI) of Synthesis Example 3B was used instead of the polyamideimide resin (PAI) of Synthesis Example 1B.

Reference Example 1B

A resin composition varnish was obtained in the same manner as Example 1B, except that an NMP solution of KS6600 (trade name of Hitachi Chemical Co., Ltd.) as a polyamideimide resin (PAI) without the structure of general formula (1) was used instead of the polyamideimide resin (PAI) of Synthesis Example 1B.

(Fabrication of Prepreg and Metal Foil-clad Laminate)

The resin composition varnishes prepared in Examples 1B-3B and Reference Example 1B were each impregnated into a 0.028 mm-thick glass cloth (trade name: 1037 by Asahi Shwebel Co., Ltd.), and then heated at 150° C. for 15 minutes for drying to obtain a prepreg with a 70 wt % resin portion.

A 12 μm-thick electrolytic copper foil (trade name: F2-WS-12 by Furukawa Electric Co., Ltd.) was stacked onto both sides of the prepreg with the adhesive sides facing the prepreg, and subjected to pressing conditions of 230° C., 90 min, 4.0 MPa to fabricate a double-sided copper clad laminate. The fabricated double-sided copper clad laminate was used for the following evaluation.

(Evaluations)
(1) The copper foil peel strength of the double-sided copper clad laminate was measured.
(2) The time until abnormalities such as swelling or peeling appeared after immersion in soldering baths at 260° C. and 288° C. was measured.
(3) The copper foil was etched for removal and the laminate was folded to evaluate the pliability. The evaluation was made in the following manner.
   ○: No fracture, × Fracture.
(4) The laminate with the copper foil removed on one side by etching was subjected to moisture absorption treatment for one hour with PCT saturation conditions of 121° C., 2 atmospheres, and then immersed for 20 seconds in a soldering bath at 260° C., upon which abnormalities such as swelling or peeling of the laminate were observed (PCT resistance). The evaluation was made in the following manner.
   ○: No abnormalities, × Abnormalities.

The obtained results are shown in Table 2.

as swelling or peeling were observed. Also, the pliability was sufficient to allow folding of the laminate as desired. Moreover, no abnormalities such as swelling or peeling were observed in the soldering bath immersion at 260° C. for 20 seconds when moisture absorption treatment was carried out under PCT saturation conditions of 121° C., 2 atmospheres.

In contrast, the prepreg or metal foil-clad laminate of Reference Example 1B had a low copper foil peel strength of 0.6 kN/m. Furthermore, the pliability was poor and fracturing occurred when the laminate was folded. In addition, the soldering heat resistance and PCT resistance were inferior, and abnormalities such as swelling and peeling were observed.

Synthesis Example 1C

In a 1-liter separable flask equipped with a cock-stoppered 25-ml water measuring receptacle connected to a reflux condenser, and a thermometer and stirrer, there were charged 29.8 g (0.12 mol) of DDS (diaminodiphenylsulfone) as a diamine with two or more aromatic rings, 34.4 g (0.04 mol) of the reactive silicone oil KF-8010 (trade name of Shin-Etsu Chemical Co., Ltd., amine equivalents: 430) as a siloxanediamine, 80.0 g (0.04 mol) of JEFFAMINE D2000 (trade name of San Techno Chemical Co., Ltd., amine equivalents: 1000) and 80.7 g (0.42 mol) of TMA (trimellitic anhydride), with 605 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 60.1 g (0.24 mol) of MDI (4,4'-diphenylmethanediisocyanate) was loaded as an aromatic diisocyanate for 2 hours of reaction at 190° C. Upon completion of the reaction there was obtained an NMP solution containing a siloxane-modified polyamideimide resin.

Synthesis Example 2C

In a 1-liter separable flask equipped with a cock-stoppered 25-ml water measuring receptacle connected to a reflux con-

TABLE 2

| Evaluation | Units | Example 1B | Example 2B | Example 3B | Reference Example 1B |
|---|---|---|---|---|---|
| PAI | — | Synthesis Example 1B | Synthesis Example 2B | Synthesis Example 3B | KS6600 |
| PAI/Ep | pts. by wt. | 80/20 | 80/20 | 80/20 | 80/20 |
| Pliability | — | ○ | ○ | ○ | × |
| 260° C. soldering | sec. | >300 | >300 | >300 | 150 |
| 288° C. soldering | sec. | >300 | >300 | >300 | 60 |
| PCT resistance | — | ○ | ○ | ○ | × |
| Copper foil peel strength | kN/m | 1.0 | 0.8 | 0.9 | 0.6 |

All of the prepregs of Examples 1B-3B containing polyamideimide resins with structures according to general formula (1) were satisfactory with high values of 0.8-1.0 kN/m for the copper foil peel strength. Also, the soldering heat resistance (260° C. soldering, 288° C. soldering) was 5 minutes or longer at both temperatures, and no abnormalities such denser, and a thermometer and stirrer, there were charged 41.1 g (0.10 mol) of BAPP (2,2-bis[4-(4-aminophenoxy)phenyl]propane) as a diamine with two or more aromatic rings, 43.0 g (0.05 mol) of the reactive silicone oil KF-8010 (trade name of Shin-Etsu Chemical Co., Ltd., amine equivalents: 430) as a siloxanediamine, 100.0 g (0.05 mol) of JEFFAM- INE D2000 (trade name of San Techno Chemical Co., Ltd., amine equivalents: 1000) and 80.7 g (0.42 mol) of TMA (trimellitic anhydride), with 603 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 60.1 g (0.24 mol) of MDI (4,4'-diphenylmethanediisocyanate) was loaded as an aromatic diisocyanate for 2 hours of reaction at 190° C. Upon completion of the reaction there was obtained an NMP solution containing a siloxane-modified polyamideimide resin.

Example 1C

After mixing 250.0 g of an NMP solution of the siloxane-modified polyamideimide resin (PAI) of Synthesis Example 1C (32 wt % solid resin content), 40.0 g of NC3000 (trade name of Nippon Kayaku Co., Ltd.) as an epoxy resin (Ep) (dimethylacetamide solution with 50 wt % solid resin content) and 0.2 g of 2-ethyl-4-methylimidazole, the mixture was stirred for about 1 hour until uniformity of the resin. Next, 20 g of OP930 (Clariant Japan) was added as a phosphorus-containing compound (phosphorus-based flame retardant) in the form of a methyl ethyl ketone slurry, and mixing was continued for one hour. The mixture was then allowed to stand for 24 hours at room temperature (25° C.) for defoaming to produce a resin composition varnish with a phosphorus content of 3.92 wt %.

Example 2C

After mixing 228.6 g of an NMP solution of the siloxane-modified polyamideimide resin (PAI) of Synthesis Example 2C (35 wt % solid resin content), 40.0 g of NC3000 (trade name of Nippon Kayaku Co., Ltd.) as an epoxy resin (Ep) (dimethylacetamide solution with 50 wt % solid resin content) and 0.2 g of 2-ethyl-4-methylimidazole, the mixture was stirred for about 1 hour until uniformity of the resin. Next, 20 g of OP930 (Clariant Japan) was added as a phosphorus-containing compound (phosphorus-based flame retardant) in the form of a methyl ethyl ketone slurry, and mixing was continued for one hour. The mixture was then allowed to stand for 24 hours at room temperature (25° C.) for defoaming to produce a resin composition varnish with a phosphorus content of 3.92 wt %.

Example 3C

After mixing 250.0 g of an NMP solution of the siloxane-modified polyamideimide resin (PAI) of Synthesis Example 1C (32 wt % solid resin content), 40.0 g of DER331L (trade name of The Dow Chemical Company) as an epoxy resin (Ep) (dimethylacetamide solution with 50 wt % solid resin content) and 0.2 g of 2-ethyl-4-methylimidazole, the mixture was stirred for about 1 hour until uniformity of the resin. Next, 20 g of OP930 (Clariant Japan) was added as a phosphorus-containing compound (phosphorus-based flame retardant) in the form of a methyl ethyl ketone slurry, and mixing was continued for one hour. The mixture was then allowed to stand for 24 hours at room temperature (25° C.) for defoaming to produce a resin composition varnish with a phosphorus content of 3.92 wt %.

Example 4C

After mixing 250.0 g of an NMP solution of the siloxane-modified polyamideimide resin (PAI) of Synthesis Example 1C (32 wt % solid resin content), 40.0 g of DER331L (trade name of The Dow Chemical Company) as an epoxy resin (Ep) (dimethylacetamide solution with 50 wt % solid resin content) and 0.2 g of 2-ethyl-4-methylimidazole, the mixture was stirred for about 1 hour until uniformity of the resin. Next, 30 g of OP930 (Clariant Japan) as a phosphorus-containing compound (phosphorus-based flame retardant) and 10.0 g of HCA-HQ (trade name of Sanko Chemical Industry Co., Ltd.) were added in the form of a methyl ethyl ketone slurry, and mixing was continued for one hour. The mixture was then allowed to stand for 24 hours at room temperature (25° C.) for defoaming to produce a resin composition varnish with a phosphorus content of 5.72 wt %.

Reference Example 1C

A resin composition with a phosphorus content of 0.06 wt % was prepared in the same manner as Example 1C, except that a liquid phosphorus compound (trade name: REOFOS 110, product of Ajinomoto Co., Inc.) was used as the phosphorus-containing compound.

Reference Example 2C

A resin composition with a phosphorus content of 3.92 wt % was prepared in the same manner as Example 1C, except for using 114.3 g of an NMP solution of the siloxane-modified polyamideimide resin (PAI) of Synthesis Example 1C (32 wt % solid resin content) and 120.0 g of NC3000 (trade name of Nippon Kayaku Co., Ltd.) as an epoxy resin (Ep) (dimethylacetamide solution with 50 wt % solid resin content).

(Fabrication of Prepreg and Metal Foil-Clad Laminate)

The resin composition varnishes prepared in Examples 1C-4C and Reference Example 1C, 2C were each impregnated into a 0.028 mm-thick glass cloth (trade name: 1037 by Asahi Shwebel Co., Ltd.), and then heated at 150° C. for 15 minutes for drying to obtain a prepreg with a 70 wt % resin portion.

A 12 μm-thick electrolytic copper foil (trade name: F2-WS-12 by Furukawa Electric Co., Ltd.) was stacked onto both sides of the prepreg with the adhesive sides facing the prepreg, and subjected to pressing conditions of 230° C., 90 min, 4.0 MPa to fabricate a double-sided copper clad laminate. The fabricated double-sided copper clad laminate was used for the following evaluation.

(Evaluations)

(1) The copper foil peel strength of the double-sided copper clad laminate was measured.

(2) The time until abnormalities such as swelling or peeling appeared after immersion in soldering baths at 260° C. and 288° C. was measured.

(3) The copper foil was etched for removal and the laminate was folded to evaluate the pliability. The evaluation was made in the following manner.

◯: No fracture, Δ: Some fracture, ×: Fracture.

(4) The flame retardance was evaluated by a UL-94 VTM test. Specifically, first the copper was etched off from the double-sided copper clad laminate, and a 200 mm long, 50 mm wide piece was cut out and wrapped around a 12.7 mm-diameter mandrel, and after fixing it with tape at a position 125 mm from the end to form a cylinder, the mandrel was slipped out to obtain a sample. The sample was then situated vertically and the top end was closed and anchored with a spring, after which the bottom end was contacted with a 20 mm blue flame created with a methane gas burner for 3 seconds and the afterflame time and combustion distance were measured.

(5) A circuit was formed on the double-sided copper clad laminate to prepare a daisy chain pattern test piece. Each test piece was subjected to 1000 cycles of a heat shock test with each cycle being −65° C./30 min, 125° C./30 min, and the change in resistance was measured. The evaluation was made in the following manner.

◯: No greater than 10% resistance change, ×: Greater than 10% resistance change.

The evaluation results are shown in Table 3.

TABLE 3

| Evaluation | Units | Example 1C | Example 2C | Example 3C | Example 4C | Reference Example 1C | Reference Example 2C |
|---|---|---|---|---|---|---|---|
| PAI | — | Synthesis Example 1C | Synthesis Example 2C | Synthesis Example 1C | Synthesis Example 1C | Synthesis Example 1C | Synthesis Example 1C |
| PAI/Ep | pts. by wt. | 80/20 | 80/20 | 80/20 | 80/20 | 80/20 | 37/60 |
| P-containing compound | — | OP930 | OP930 | OP930 | OP930 HCA-HQ | REOFOS 110 | OP930 |
| P content | wt % | 3.92 | 3.92 | 3.92 | 5.72 | 0.06 | 3.92 |
| Pliability | — | ◯ | ◯ | ◯ | ◯ | Δ | x |
| Flame retardance | — | VTM-0 | VTM-0 | VTM-0 | VTM-0 | HB | — |
| Combustion distance* | mm | 80 | 80 | 80 | 80 | 125 | — |
| 260° C. soldering | sec. | >300 | >300 | >300 | >300 | 40 | 50 |
| 288° C. soldering | sec. | >300 | >300 | >300 | >300 | 10 | 20 |
| Heat shock test | — | ◯ | ◯ | ◯ | ◯ | x | x |
| Copper foil peel strength | kN/m | 1.0 | 1.0 | 0.9 | 0.8 | 0.6 | 0.5 |

*UL-94 VTM test

All of the prepregs of Examples 1C-4C were satisfactory with high values of 0.8-1.0 kN/m for the copper foil peel strength. Also, the soldering heat resistance (260° C. soldering, 288° C. soldering) was 5 minutes or longer at both temperatures, and no abnormalities such as swelling or peeling were observed. The combustion distance of each 12.7 mm-diameter test piece in the UL94 VTM test was less than 100 mm (80 mm), and the flame retardance was VTM-0 in all cases. In the heat shock test, the resistance change was within 10% at 1000 cycles, indicating satisfactory connection reliability.

In contrast, the copper foil peel strength of the prepreg of Reference Example 1C which had a phosphorus content of 0.06 wt % was a low value of 0.6 kN/m, while the flame retardance was HB and the combustion distance was 125 mm. Also, Reference Example 2C which contained a thermosetting (epoxy) resin at 162 parts by weight with respect to 100 parts by weight of the polyamideimide resin had poor pliability and exhibited fracturing when the laminate was folded. Thus, no sample could be prepared for flame retardance evaluation, and measurement of the combustion distance was impossible. Also, both Reference Examples 1C and 2C had inferior soldering heat resistance, abnormalities such as swelling and peeling were observed, and the resistance value varied considerably in the heat shock test. In the heat shock test, the change in resistance value was greater than 10% at 200 cycles with Reference Example 1C and at 100 cycles with Reference Example 2C.

Synthesis Example 1D

In a 1-liter separable flask equipped with a cock-stoppered 25-ml water measuring receptacle connected to a reflux condenser, and a thermometer and stirrer, there were charged 12.4 g (0.05 mol) of DDS (diaminodiphenylsulfone) as a diamine with two or more aromatic rings, 51.6 g (0.06 mol) of the reactive silicone oil KF-8010 (trade name of Shin-Etsu Chemical Co., Ltd., amine equivalents: 430) as a siloxanediamine, 72.0 g (0.036 mol) of JEFFAMINE D2000 (trade name of San Techno Chemical Co., Ltd., amine equivalents: 1000), 11.34 g (0.054 mol) of WONDAMINE (trade name of New Japan Chemical Co., Ltd.) and 80.68 g (0.42 mol) of TMA (trimellitic anhydride), with 612 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 60.1 g (0.24 mol) of MDI (4,4'-diphenylmethanediisocyanate) was loaded as an aromatic diisocyanate for 2 hours of reaction at 190° C. Upon completion of the reaction there was obtained an NMP solution containing a siloxane-modified polyamideimide resin.

Synthesis Example 2D

In a 1-liter separable flask equipped with a cock-stoppered 25-ml water measuring receptacle connected to a reflux condenser, and a thermometer and stirrer, there were charged 24.63 g (0.06 mol) of BAPP (2,2-bis[4-(4-aminophenoxy)phenyl]propane) as a diamine with two or more aromatic rings, 124.6 g (0.14 mol) of the reactive silicone oil KF-8010 (trade name of Shin-Etsu Chemical Co., Ltd., amine equivalents: 445) as a siloxanediamine and 80.68 g (0.42 mol) of TMA (trimellitic anhydride), with 539 g of NMP (N-methyl-2-pyrrolidone) as an aprotic polar solvent, and the mixture was stirred at 80° C. for 30 minutes.

Next, 150 ml of toluene was loaded as an aromatic hydrocarbon for azeotropic distillation with water, and the temperature was raised for 2 hours of reflux at about 160° C. When approximately 7.2 ml of water had accumulated in the water measuring receptacle, cessation of water distillation was confirmed, and the temperature was raised to about 190° C. for removal of the toluene while removing the distillate accumulated in the water measuring receptacle. Next, the solution was returned to room temperature (25° C.), and 60.07 g (0.24 mol) of MDI (4,4'-diphenylmethanediisocyanate) was loaded as an aromatic diisocyanate for 2 hours of reaction at 190° C. Upon completion of the reaction there was obtained an NMP solution containing a siloxane-modified polyamideimide resin.

Example 1D

After mixing 218.75 g of an NMP solution of the siloxane-modified polyamideimide resin of Synthesis Example 1D (32 wt % solid resin content), 60.0 g of NC3000 (epoxy resin, trade name of Nippon Kayaku Co., Ltd.) as a thermosetting resin (dimethylacetamide solution with 50 wt % solid resin content), 0.3 g of 2-ethyl-4-methylimidazole and 0.5 g of 4,4'-butylidenebis(3-methyl-6-t-butylphenol) as a hindered phenol-based antioxidant, the mixture was stirred for about 1 hour until uniformity of the resin. Next, 20 g of OP930 (trade name of Clariant Japan) was added as a phosphorus-containing filler in the form of a slurry with 40 g of methyl ethyl ketone, and mixing was continued for one hour. The mixture was then allowed to stand for 24 hours at room temperature (25° C.) for defoaming to produce a resin composition varnish.

Example 2D

After mixing 218.75 g of an NMP solution of the siloxane-modified polyamideimide resin of Synthesis Example 1D (32 wt % solid resin content), 60.0 g of DER331L (epoxy resin, trade name of The Dow Chemical Company) as a thermosetting resin (dimethylacetamide solution with 50 wt % solid resin content), 0.3 g of 2-ethyl-4-methylimidazole and 0.5 g of 1,1,3-tris(2-methyl-4-hydroxy-5-t-butylphenyl)butane as a hindered phenol-based antioxidant, the mixture was stirred for about 1 hour until uniformity of the resin. Next, 15 g of OP930 (trade name of Clariant Japan) was added as a phosphorus-containing filler in the form of a slurry with 30 g of methyl ethyl ketone, and mixing was continued for one hour. The mixture was then allowed to stand for 24 hours at room temperature (25° C.) for defoaming to produce a resin composition varnish.

Example 3D

After mixing 218.75 g of an NMP solution of the siloxane-modified polyamideimide resin of Synthesis Example 1D (32 wt % solid resin content), 60.0 g of ZX-1548-2 (epoxy resin, trade name of Tohto Kasei Co., Ltd.) as a thermosetting resin (dimethylacetamide solution with 50 wt % solid resin content), 0.3 g of 2-ethyl-4-methylimidazole and 0.5 g of dilauryl thiopropionate as an organic sulfur compound-based antioxidant, the mixture was stirred for about 1 hour until uniformity of the resin. Next, 20 g of OP930 (trade name of Clariant Japan) was added as a phosphorus-containing filler in the form of a slurry with 40 g of methyl ethyl ketone, and mixing was continued for one hour. The mixture was then allowed to stand for 24 hours at room temperature (25° C.) for defoaming to produce a resin composition varnish.

Example 4D

A resin composition varnish was produced in the same manner as Example 1D, except that 200.0 g of an NMP solution of the siloxane-modified polyamideimide resin of Synthesis Example 2D (35 wt % solid resin content) was used instead of the siloxane-modified polyamideimide resin of Synthesis Example 1D.

Example 5D

A resin composition varnish was produced in the same manner as Example 2D, except that 200.0 g of an NMP solution of the siloxane-modified polyamideimide resin of Synthesis Example 2D (35 wt % solid resin content) was used instead of the siloxane-modified polyamideimide resin of Synthesis Example 1D.

Reference Example 1D

A resin composition varnish was produced in the same manner as Example 1D, except for not adding the hindered phenol-based antioxidant 4,4'-butylidenebis(3-methyl-6-t-butylphenol).

Reference Example 2D

A resin composition varnish was produced in the same manner as Example 2D, except for not adding the hindered phenol-based antioxidant 1,1,3-tris(2-methyl-4-hydroxy-5-t-butylphenyl)butane.

Reference Example 3D

A resin composition varnish was produced in the same manner as Example 3D, except for not adding the organic sulfur compound-based antioxidant dilauryl thiopropionate.

Reference Example 4D

A resin composition varnish was produced in the same manner as Example 4D, except for not adding the hindered phenol-based antioxidant 4,4'-butylidenebis(3-methyl-6-t-butylphenol).

Reference Example 5D

A resin composition varnish was produced in the same manner as Example 5D, except for not adding the hindered phenol-based antioxidant 1,1,3-tris(2-methyl-4-hydroxy-5-t-butylphenyl)butane.

(Fabrication of Prepreg and Double-Sided Copper Clad Laminate)

The resin composition varnishes prepared in Examples 1D-5D and Reference Examples 1D-5D were each impregnated into a 0.028 mm-thick glass cloth (trade name: 1037 by Asahi Shwebel Co., Ltd.), and then heated at 150° C. for 15 minutes for drying to obtain a prepreg with a 70 wt % solid resin portion. A 12 μm-thick electrolytic copper foil (trade name: F2-WS-12 by Furukawa Electric Co., Ltd.) was stacked onto both sides of a prepreg with the adhesive sides facing the prepreg, and subjected to pressing conditions of 230° C., 90 min, 4.0 MPa to fabricate a double-sided copper clad laminate. Also, eight prepregs were stacked together, and a 12 μm-thick electrolytic copper foil (trade name: F2-WS-12 by Furukawa Electric Co., Ltd.) was stacked onto both sides thereof with the adhesive sides facing the prepreg, and then subjected to pressing conditions of 230° C., 90 min, 4.0 MPa to fabricate a double-sided copper clad laminate. The double-sided copper clad laminate fabricated with a single prepreg was subjected to the following evaluations (1) to (4). The double-sided copper clad laminate fabricated with eight prepregs was subjected to the following evaluations (5) and (6).

(Evaluations)
(1) The copper foil peel strength of the double-sided copper clad laminate was measured.
(2) The time until abnormalities such as swelling or peeling appeared after immersion in soldering baths at 260° C. and 300° C. was measured.
(3) The copper foil was etched for removal and the laminate was folded to evaluate the pliability. The evaluation was made in the following manner.
◯: No fracture, Δ: Some fracture, ×: Fracture.
(4) The flame retardance was evaluated by a UL-94 VTM test. Specifically, first the copper was etched off from the double-sided copper clad laminate, and a 200 mm long, 50 mm wide piece was cut out and wrapped around a 12.7 mm-diameter mandrel, and after fixing it with tape at a position 125 mm from the end to form a cylinder, the mandrel was slipped out to obtain a sample. The sample was then situated vertically and the top end was closed and anchored with a spring, after which the bottom end was contacted with a 20 mm blue flame created with a methane gas burner for 3 seconds and the combustion distance was measured. Samples with a combustion distance of 100 mm or less were assigned a flame retardance of VTM-0.
(5) A circuit was formed on the double-sided copper clad laminate to prepare a daisy chain pattern test piece. Each test piece was subjected to 1000 cycles of a heat shock test with each cycle being −65° C./30 min, 125° C./30 min, and the change in resistance was measured. The evaluation was made in the following manner.
OK: No greater than 10% resistance change, NG: Greater than 10% resistance change.
(6) A circuit was formed on the double-sided copper clad laminate and used for a migration test. The through-holes were created with a 0.9 mm-diameter drill under conditions of 60,000 rpm, 1.800 mm/min feed rate. The spacing between hole walls was 350 μm, and the insulation resistance of 400 holes (200 locations between through-hole/through-hole) was periodically measured for each sample. The test conditions were an environment of 85° C./90% RH and application of 100 V, and the measurement was carried out for a number of days until interruption of current between the through-holes occurred. Measurement of the insulation resistance was conducted at 100V/1 min, and interruption of current was defined as less than $10^8 \Omega$. The evaluation results are shown in Table 4.

The copper foil peel strengths of the double-sided copper clad laminates of Examples 1D-5D were satisfactory high values of 0.8-1.1 kN/m. Also, the soldering heat resistance (260° C. soldering, 300° C. soldering) was 5 minutes or longer at both temperatures, and no abnormalities such as swelling or peeling were observed. The combustion distance of each 12.7 mm-diameter test piece in the UL94 VTM test was less than 100 mm, and the flame retardance was VTM-0 in all cases. In the heat shock test, the resistance change was within 10% at 1000 cycles, indicating satisfactory connection reliability. Also, the pliability was sufficient to allow folding as desired. Also, Examples 1D-5D which included the (c) antioxidant exhibited no interruption of current for more than 60 days, and had higher insulation properties than Reference Examples 1D-5D. The insulation resistance value was $10^{11} \Omega$ or greater after 60 days with Examples 1D-5D.

The invention claimed is:

1. A prepreg obtained by impregnating a resin composition comprising a resin with an imide structure and a thermosetting resin into a fiber base material with a thickness of 5-50 μm, wherein said resin with an imide structure is a polyamideimide resin having the structure represented by the following general formula (9):

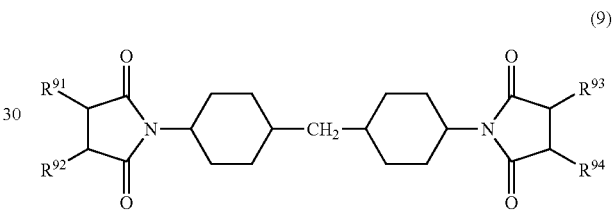

[Chemical Formula 9]

[wherein $R^{91}$, $R^{92}$, $R^{93}$ and $R^{94}$ each represent a carbon atom from a portion of the cyclic or linear structure composing the polyamideimide resin].

2. A prepreg according to claim 1, wherein said resin with an imide structure has a siloxane structure.

3. A prepreg according to claim 1, wherein said thermosetting resin is an epoxy resin.

4. A prepreg according to claim 1, wherein said thermosetting resin is an epoxy resin with two or more glycidyl groups.

TABLE 4

| Evaluation | Units | Example 1D | Example 2D | Example 3D | Example 4D | Example 5D | Reference Example 1D | Reference Example 2D | Reference Example 3D | Reference Example 4D | Reference Example 5D |
|---|---|---|---|---|---|---|---|---|---|---|---|
| Number of days to current interruption | Days | >60 | >60 | >60 | >60 | >60 | 30 | 7 | 10 | 35 | 11 |
| Copper foil peel strength | kN/m | 1.1 | 0.9 | 1.0 | 0.8 | 0.9 | 0.8 | 0.8 | 0.8 | 0.8 | 0.8 |
| 260° C. soldering heat resistance | sec. | >300 | >300 | >300 | >300 | >300 | >300 | >300 | >300 | >300 | >300 |
| 300° C. soldering heat resistance | sec. | >300 | >300 | >300 | >300 | >300 | >300 | >300 | >300 | >300 | >300 |
| Heat shock test | — | OK | OK | OK | OK | OK | OK | OK | OK | OK | OK |
| Pliability | — | ◯ | ◯ | ◯ | ◯ | ◯ | ◯ | ◯ | ◯ | ◯ | ◯ |
| Flame retardance | — | VTM-0 | VTM-0 | VTM-0 | VTM-0 | VTM-0 | VTM-0 | VTM-0 | VTM-0 | VTM-0 | VTM-0 |

5. A prepreg according to claim 1, wherein said resin composition further contains a phosphorus-containing compound, and said resin composition contains said thermosetting resin at 1-140 parts by weight with respect to 100 parts by weight of said resin with an imide structure, and phosphorus at 0.1-5 wt % of the total weight of the resin solid portion.

6. A prepreg according to claim 1, wherein said resin composition further contains a hindered phenol-based or organic sulfur compound-based antioxidant.

7. A prepreg according to claim 6, wherein said antioxidant is one or more types of antioxidant selected from the group consisting of butylated hydroxyanisole, 2,6-di-t-butyl-4-ethylphenol, 2,2'-methylene-bis(4-methyl-6-t-butylphenol), 4,4'-thiobis-(3-methyl-6-t-butylphenol), 4,4'-butylidenebis(3-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis-[methylene-3-(3', 5'-di-t-butyl-4'-hydroxyphenylpropionate)methane, dilauryl thiodipropionate and distearyl thiodipropionate.

8. A prepreg according to claim 1, which has a combustion distance of no greater than 100 mm in a UL-94 VTM test, when cured to form a base material.

9. A metal foil-clad laminate obtained by stacking a prescribed number of prepregs according to claim 1, situating a metal foil on either or both sides thereof and subjecting the stack to heat and pressure.

10. A printed circuit board obtained by forming a circuit on the metal foil of a metal foil-clad laminate according to claim 9.

11. A prepreg according to claim 1, wherein said polyamideimide resin contains at least 70 mol % of a polyamideimide molecule having at least 10 amide groups in the molecule.

12. A prepreg according to claim 1, wherein said film base material is a glass cloth with a thickness of 5-50 μm.

* * * * *